United States Patent [19]
Norman

[11] Patent Number: 6,023,492
[45] Date of Patent: Feb. 8, 2000

[54] METHOD AND APPARATUS FOR CONDITIONALLY COMBINING BIT METRICS IN A COMMUNICATION SYSTEM

[75] Inventor: John Mårten Norman, Sollentuna, Sweden

[73] Assignee: Telefonaktiebolaget LM Ericsson, Stockholm, Sweden

[21] Appl. No.: 08/562,382

[22] Filed: Nov. 24, 1995

[51] Int. Cl.$^7$ .............................. H03D 1/00; H04L 27/00
[52] U.S. Cl. ............................................ 375/341; 375/262
[58] Field of Search ..................... 375/341, 262, 375/265, 264; 370/537, 532; 341/94, 899; 364/750.5, 736.01

[56] References Cited

U.S. PATENT DOCUMENTS

| | | | |
|---|---|---|---|
| 4,390,987 | 6/1983 | Best | 370/112 |
| 4,513,388 | 4/1985 | Veendrick et al. | 364/736 |
| 4,536,878 | 8/1985 | Rattlingourd et al. | |
| 4,571,734 | 2/1986 | Dolivi et al. | |
| 4,606,027 | 8/1986 | Otani | |
| 5,027,374 | 6/1991 | Rossman | |
| 5,185,714 | 2/1993 | Nakayama | |
| 5,258,940 | 11/1993 | Coker et al. | |
| 5,295,178 | 3/1994 | Nickel et al. | |
| 5,331,665 | 7/1994 | Busschaert et al. | |
| 5,341,386 | 8/1994 | Shimoda | |
| 5,583,889 | 12/1996 | Citta et al. | 375/341 |
| 5,588,011 | 12/1996 | Riggle | 371/43 |
| 5,768,316 | 6/1998 | Sogo | 375/260 |

FOREIGN PATENT DOCUMENTS

0 467 522  1/1992  European Pat. Off.
0 700 164  3/1996  European Pat. Off.

OTHER PUBLICATIONS

Internaitonal Search Report re PCT/SE96/01438 Mar. 17, 1997.

European Standard Search Report No. RS 96055 Jun. 20, 1996.

*Primary Examiner*—Chi H. Pham
*Assistant Examiner*—Jean B Corrielus
*Attorney, Agent, or Firm*—Burns, Doane, Swecker & Mathis, L.L.P.

[57] ABSTRACT

Methods and apparatuses for evaluating expressions used, for example, in convolutional decoders are described. By arranging digital logic elements in a manner designed to minimize the number of additions performed while evaluating hypothetical bit sequences, decoder performance is improved. Bit metrics and combinations thereof are first determined and supplied to a multiplexor. The multiplexor can then be controlled to output the selected one of the bit metrics or combinations thereof which is to be added to an accumulated path metric.

8 Claims, 6 Drawing Sheets

FIG. 7
PRIOR ART

METHOD AND APPARATUS FOR CONDITIONALLY COMBINING BIT METRICS IN A COMMUNICATION SYSTEM

BACKGROUND

The present invention relates generally to systems for performing arithmetic operations, and in particular, to a method and apparatus for expediting the evaluation of an expression commonly used in signal processing of convolutionally encoded information to combine metrics associated with state changes.

Perhaps even more than other types of communications, radio communication suffers from the irregularities of its transmission medium. Radio communication system designers must compensate for time dispersion, fading and other changes in radio channels which impact transmitted signals. Frequently, these irregularities cause random bit errors. One way in which random bit errors are combatted in radio communication systems is by convolutionally encoding the signals prior to transmission.

In a convolutional code, code digits generated by an encoder in a particular time unit depend not only on the data to be characterized by those bits, but also on the code digits in a previous span of time units. A convolutional decoder operates by manipulating candidate code sequences through shift registers and decoding each new bit by evaluating its probable value (e.g., 1 or 0) in view of previously received bits.

By predicating the encoding scheme of each bit on the values of other, earlier transmitted data bits, a decoder can correctly reconstruct received data sequences which, to an extent, include random bit errors.

Figure 1A:
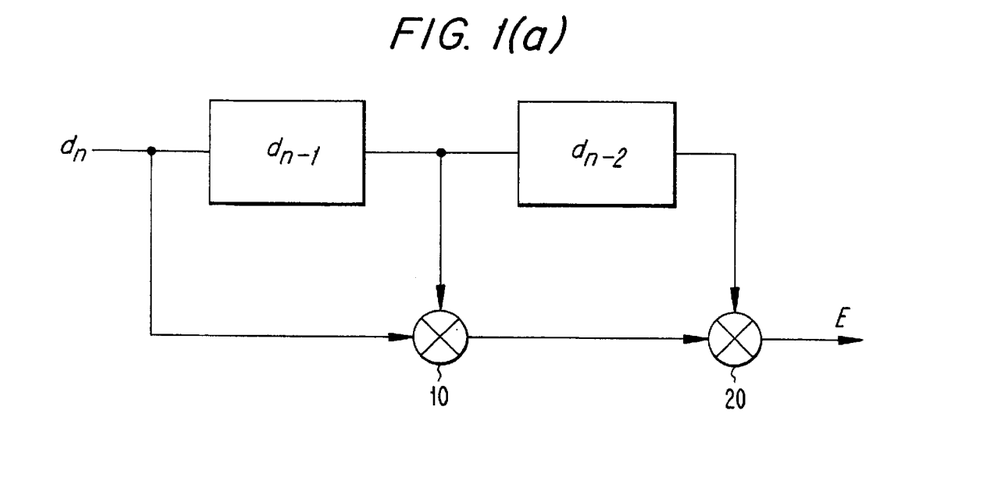
FIG. 1(a) is a block diagram of an exemplary convolutional encoding scheme.

This type of encoding can be referred to as polynomial encoding, where the polynomial describes the code relationship between previous bits and a current bit. Consider the encoder hardware illustrated as FIG.(a). Therein, encoded output of a bit depends upon the values of two previous bits and the current input bit. Specifically, a value of a current bit $d_n$ is added modulo-2 (i.e., exclusive OR'ed) with the value of a previous bit $d_{n-1}$ at block 10. Then, the output of block 10 is added modulo-2 with the value of the bit prior to $d_{n-2}$ at block 20 to provide an encoded output. This exemplary type of encoding can be described by the polynomial

| $d_{n-2}$ | $d_{n-1}$ | $d_n$ | E |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

Figure 1B:
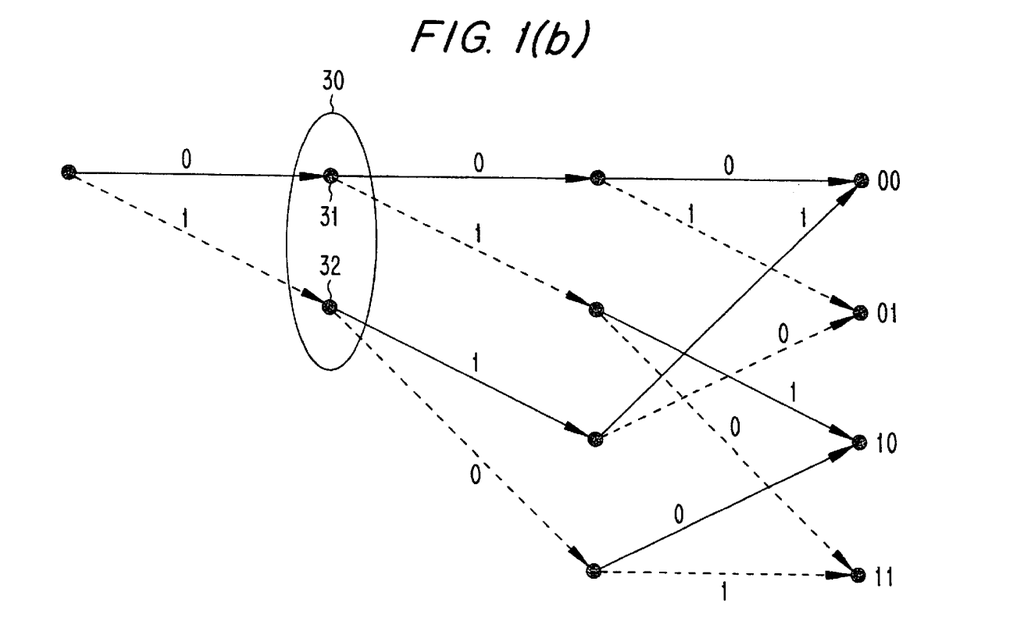
FIG. 1(b) depicts a trellis diagram used to describe the convolutional encoding scheme of FIG. 1(a)

A trellis diagram is a form of code tree that is helpful in illustrating how systems employing convolutional codes operate. The exemplary trellis diagram of FIG. 1(b) depicts coded output of the encoder of FIG. 1(a) for possible sequences of two digits wherein an initial value for $d_{n-1}$ and $d_{n-2}$ are zero. Accordingly, the depicted trellis diagram corresponds to an encoder having four states (i.e., 00, 01, 10, 11). The binary values that constitute these states correspond to the values of $d_{n-2}$ and $d_{n-1}$, respectively. The output E of the encoder is thus controlled by $d_n$, $d_{n-1}$, $d_{n-2}$ and the generator polynomial. In the illustration of FIG. 1(b), the encoder output values E are given by the binary values depicted in the figure, each of which is associated with an arrow emanating from a node. The type of arrow indicates the value of $d_n$ (solid: $d_n=0$, dotted $d_n=1$) associated with each path through the trellis.

Consider the nodes encircled by line 30. At node 31, the current state remains 00. If $d_n=0$ (solid arrow emanating from right side of node 31), then the encoder output is also zero and the state remains 00. This is in accordance with the top row of the logic table illustrated above. If, on the other hand, $d_n=1$ (dotted arrow emanating from right side of node 31) then the encoder output E is 1 (as shown in the second row from the top of the logic table above) and a transition is made to state 01.

Next, consider node 32. At this node current state is 01 since $d_n=1$ occurred as an input to this node from state 00. If the next $d_n=0$ (solid arrow emanating from right side of node 32), then the encoder output is one and the state transitions to 10 (as shown by the third row from the top of the logic table). If, on the other hand, $d_n=1$ (dotted arrow emanating from right side of node 31) then the encoder output E is zero (as shown in the fourth row from the top of the logic table above) and a transition is made to state 11.

Having encoded and transmitted a data sequence, the next task in, for example, a radiocommunication system is to receive and decode the signal. A common technique for enhancing the decoding of convolutionally encoded data is to use Viterbi's maximum likelihood algorithm. A maximum likelihood receiver operates by selecting a known bit sequence closest to a received bit sequence. Because $2^k$ bit sequences are involved (k being the number of data bits within a frame) in an ordinary convolutional maximum likelihood receiver decoder, the system stores the $2^k$ bit sequences for comparison with a received bit sequence. For a large value of k, this can be unwieldy. Viterbi simplified the maximum likelihood evaluation by noting that each of the states represented has only a finite number of possible predecessor states, and that only the path (e.g., through the trellis diagram) that agrees most with the received sequence (the minimum distance path) need be retained for each state. For the trellis diagram depicted in FIG. 1(b), this is noted by considering that for each of the four states (00, 01, 10 and 11) each has only two possible predecessor states. That is, each node can only be reached through two states (e.g., you can only reach the 00 state from a previous 00 state or from a 10 state). Viterbi recognized that the likelihood evaluation could be significantly enhanced by using this factor in assessing possible paths through a trellis diagram, or like table.

Each possible path, or combination of state transitions, has an associated likelihood, or probability, of being correct. The probability of any given transition is based on the value of a newly received value, in view of a succession of predecessor values. The transition probabilities are commonly referred to as metrics or bit metrics, and a succession of bit metrics are referred to as a path metric denoting the likelihood of a sequence of possible state transitions.

Consider an example wherein a data bit stream is encoded using a Viterbi convolutional encoder to generate an encoded bit stream. To introduce redundancy, two code generators are used to produce two separate code bit streams, each based on the same data bit stream. The two bit streams are interleaved and transmitted over a medium, e.g., an air interface, that renders the bit streams susceptible to random bit errors. At the receiver, the bit streams are received by a detector. The detector produces a pair of outputs: a detected binary value (e.g., 1 or 0); and a metric indicating the probability of the detected binary value being correct. This information is then deinterleaved and passed to a decoder for evaluation as described above. In the examples discussed herein, a lowest accumulated metric value indicates a high probability of correctness, however, those skilled in the art will be aware that other metric conventions can be used.

Figure 2:
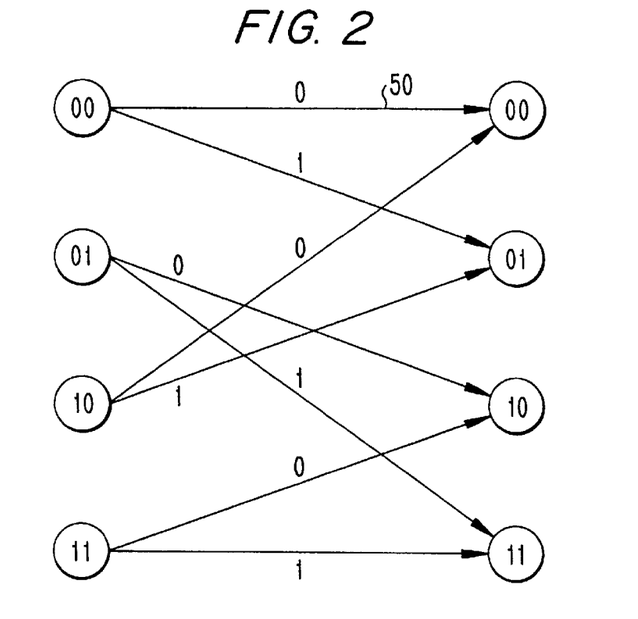
FIG. 2 is a simplified trellis diagram used to describe exemplary conditional additions which may be performed while evaluating trellis paths.

Consider a somewhat oversimplified example of a decoder having, for example, four states for processing the deinterleaved bit streams wherein each state corresponds to a proposed bit sequence. This decoding example is illustrated in FIG. 2 as a four state trellis. The selection of the correct proposed bit sequence depends on the accumulated metric associated with each path tested by the decoder. In this example, an accumulated path metric is generated for each bit received. Each bit received alters the assessment of the possible paths through the trellis. Hence, for each bit received, a metric associated with the decoder's level of certainty of the value, i.e., 0 or 1, of that bit is conditionally added to the accumulated path metric. For the example given above wherein two bit streams, each having an associated metric, are received, the capability to quickly and efficiently evaluate the various metric sums is desirable.

Evaluation of the accumulated path metric, in the context of performing the decoding process, requires repeated evaluation of the expression given by Equation (1):

$$x(n,m) = n*a + m*b \qquad (1)$$

where: a and b are metrics in the form of numerical constants (integer or floating point);

n and m are binary state integer variables;

* corresponds to multiplication; and

+ corresponds to addition.

The values of a and b above represent the metric values corresponding to the first and second bit streams, respectively. The metrics, a and b, are used for assessing the probable correctness of the proposed received bit in the context of the various possible paths through the trellis. The addition of either or both of the metrics to the accumulated path metric is controlled by the binary integer state variables n and m. Output from Equation 1 is given by the following table which illustrates the usage of these metrics to indicate possible errors in the hypothesized bit streams.

TABLE 1

| | |
|---|---|
| 0 | no bit errors in either bit stream |
| a | bit error in the first bit stream only |
| b | bit error in the second bit stream only |
| a+b | bit errors in both bit streams |

A numerical example will aid the description. Suppose that a first bit, corresponding to a first bit in a bit stream encoded using a first polynomial, is detected as a logical "0" with a 70% certainty. A second bit, corresponding to the same original bit stream, albeit encoded at the transmitter with a different polynomial, is received by the detector, and determined to be a logical "1" with a 90% certainty. After deinterleaving, a decoder, e.g., a Viterbi decoder, will then evaluate the different paths available between the plurality of states used in the trellis. In this simplified example, there are four states and eight paths.

For example, with reference to FIG. 2, the decoder, operating on the first deinterleaved bit, will evaluate the hypothetical transition between states 00 and 00, i.e., testing a transition denoted by the topmost arrow 50 where the hypothesized bit is a logical "0" as indicated by the "0" above arrow 50. Since the metric associated with this bit indicates that the received bit is believed to be a zero, the decoder will add zero, i.e., no bit error, for this bit stream to the accumulated metric. At the same time, the decoder, when operating on the second deinterleaved bit, will evaluate this state transition, however, with a different result. Since the transition indicates a hypothetical logical "0", and the received bit is believed to be a logical "1" with a 90% certainty level, the decoder will add 0.9 to the accumulated metric. Thus, this example can be described by the third row of Table 1 above.

Figure 3:
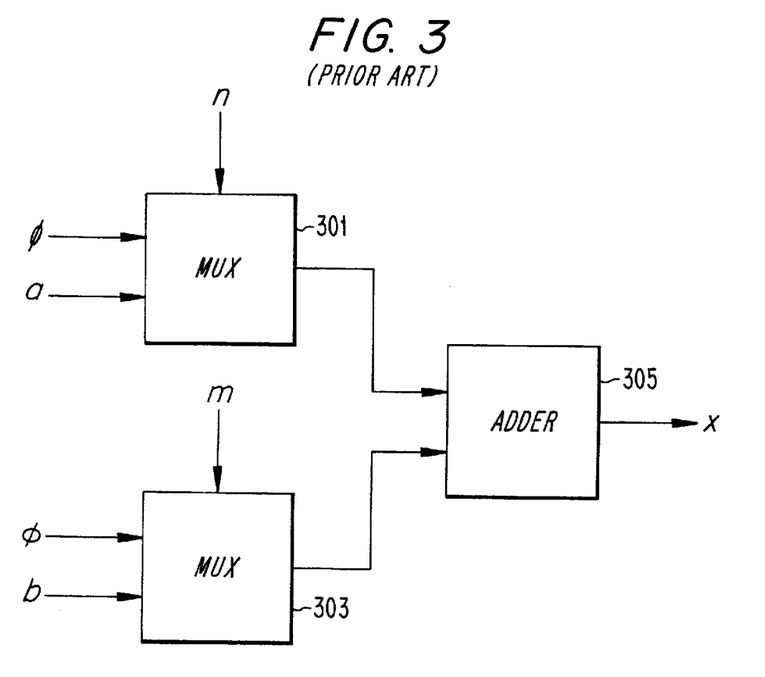
FIG. 3 is a conventional circuit arrangement for evaluating the expression given by Equation 1.

In a conventional system, Equation (1) is evaluated by the circuit arrangement depicted in FIG. 3. In this arrangement, the multiplexors (MUXs) 301 and 303 will output either a zero or their respective constants (a and/or b) based on the binary input control signals n and m. Regardless of the output selection, the outputs of the MUXs are added together by adder 305 to produce an output x. The output x is then added to the accumulated metric associated with that path.

A problem with the arrangement of FIG. 3 is that, notwithstanding the ultimate output value x, the adder 305 is used for the evaluation of every path in the trellis. However, adders are relatively complex (and hence slower) as compared to other digital logic devices, for example multiplexors. Accordingly, use of the adder 305, in the conventional manner depicted in FIG. 3, slows the solution speed of the evaluation of Equation (1). It is desirable however, to be able to quickly and efficiently evaluate path metric, especially in view of present digital signal processing wherein high bit rates are commonly used to transmit and receive data.

SUMMARY

According to exemplary embodiments of the present invention, Applicant has recognized that the bit metrics which are accumulated to provide a plurality of path metrics vary relatively slowly as compared to the number of times that they are used in the computations. That is, for each bit received, each decoder has a bit metric that is used many times over to recalculate Equation (1) depending upon the number of states in the convolutional decoder. For some of the outputs, e.g., the first three rows of Table 1, no addition is actually needed since one or more addends may be zero. Other additions of the same metrics may be performed multiple times.

Rather than using an adder for every iteration of Equation (1), Applicant has instead created a new circuit arrangement which is used to evaluate Equation (1) to reduce the number of additions and thereby improve performance of the overall system. According to exemplary embodiments of the present invention, the bit metrics are first added together and then the appropriate combination of bit metrics (or an individual bit metric) is output using a multiplexor. In this way, each possible combination of bit metrics is computed only once which increases the speed of the calculation.

The foregoing description provides examples wherein two interleaved bit streams are received for combination of metrics in a receiver. However, those skilled in the art, will appreciate that the present invention can also be extended to include instances where three or more interleaved bit streams are received and, thus, three or more metrics are conditionally combined in various ways. Thus, according to another exemplary embodiment of the present invention, a plurality of adders may be used to supply inputs to a multiplexor to provide all of the various combinations of metrics which may be needed depending upon the number of bit streams that are received.

DESCRIPTION OF THE DRAWINGS

The foregoing, and other objects, features and advantages of the present invention will be more readily understood upon reading the following detailed description in conjunction with the drawings in which.

DETAILED DESCRIPTION

The present invention provides a method and apparatus for expediting the evaluation of the expression given in Equation (1) for the purpose of, for example, improving the performance of convolutional decoders. In accordance with the present invention, methods and apparatuses for evaluating path metrics associated with the decoding process are significantly enhanced, e.g., in terms of speed, by first adding all of the combinations of bit metrics that may be used as outputs together and then selecting the desired metric or sum of metrics that is to be added to the accumulated metric for each path to be evaluated.

Figure 4:
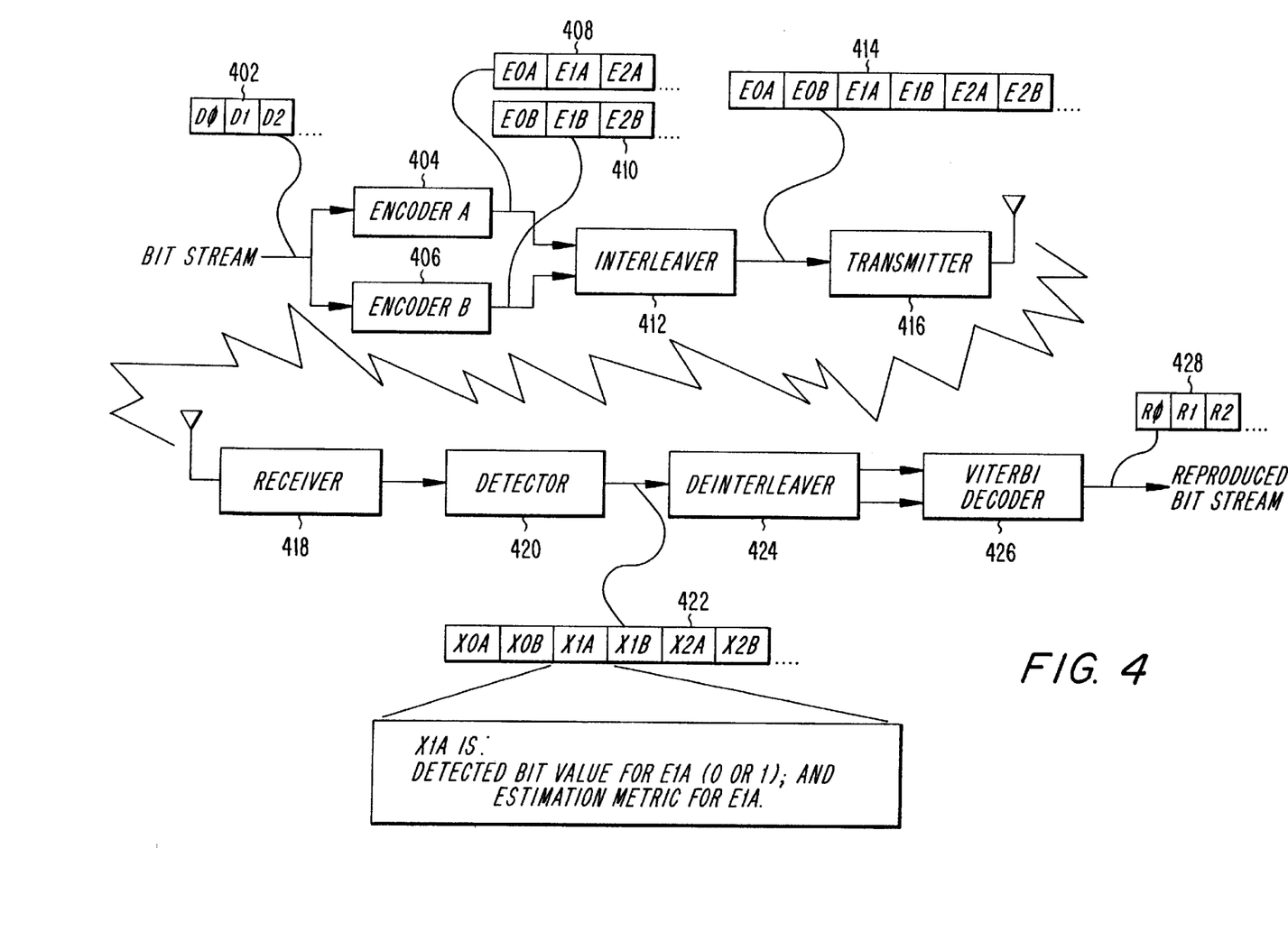
FIG. 4 is a block diagram illustrating a radiocommunication system in which the present invention can be applied.

To provide a reference point for this discussion, a more detailed description of a radiocommunication system having interleaved bit streams will now be described. An example of such a system is illustrated in FIG. 4. To introduce redundancy, a sequence of data bits 402 is provided to both a first encoder 404 and a second encoder 406. The first and second encoders 404 and 406 generate first and second encoded sequences 408 and 410 using different generator polynomials. Thus, sequences 408 and 410 contain the same data but are encoded differently. The encoded sequences 408 and 410 are interleaved by an interleaver 412 to produce an interleaved sequence 414. The interleaved sequence 414 is provided to a transmitter 416 for transmission. The interleaved sequence is transmitted over a medium, e.g., an air interface, that renders the bit streams susceptible to random bit errors. The transmitted interleaved sequence is received by a receiver 418. A detector 420 generates a candidate sequence 422 from information received by the receiver 418. The candidate sequence 422 contains data (e.g., $X_{OA}$) comprising detected bit values (e.g., $E_{OA}$) and a metric value corresponding to each bit value which indicates a confidence level of detector 420 with respect to that bit value. The candidate sequence 422 is provided to a deinterleaver 424 to separate the candidate sequence 422 into sequences corresponding to those generated by encoders 404 and 406. The deinterleaver 424 produces a pair of outputs that are provided to a Viterbi decoder 426. The Viterbi decoder 426 interprets the pair of outputs which comprise a detected binary value (e.g., 1 or 0); and a metric indicating the probability of the detected binary value being correct to reproduce the original bit stream as sequence 428.

To show how conditional additions of the metric values are performed in decoder 426 according to the present invention, consider again the example provided above with respect to FIG. 2. For a particular bit of interest, assume that a hypothesized bit for the first stream is a logical "0" with 70% certainty and that a hypothesized bit for the second stream is a logical "1" with a 90% certainty. The tables below summarize the various paths which can be evaluated.

TABLE 2

| Current State | Next State | Hypothesized Bit | Metric To Be Accumulated |
|---|---|---|---|
| 00 | 00 | 0 | 0 |
| 00 | 01 | 1 | 0.7 |
| 01 | 10 | 0 | 0 |
| 01 | 11 | 1 | 0.7 |
| 10 | 00 | 0 | 0 |
| 10 | 01 | 1 | 0.7 |
| 11 | 10 | 0 | 0 |
| 11 | 11 | 1 | 0.7 |

TABLE 3

| Current State | Next State | Hypothesized Bit | Metric To Be Accumulated |
|---|---|---|---|
| 00 | 00 | 0 | 0.9 |
| 00 | 01 | 1 | 0 |
| 01 | 10 | 0 | 0.9 |
| 01 | 11 | 1 | 0 |
| 10 | 00 | 0 | 0.9 |
| 10 | 01 | 1 | 0 |
| 11 | 10 | 0 | 0.9 |
| 11 | 11 | 1 | 0 |

For each row in the fourth column of Tables 2 and 3, the values of the corresponding rows are combined and the sum added to an accumulated path metric which takes into account the evaluations of previous hypotheses. In this very simple example having just two bit streams and four states only two sums are needed, i.e., 0+0.7 and 0+0.9. Thus, for these exemplary values, the only two outputs of equation (1) would be a or b individually. This particular example was selected because it points out a situation where no additions are actually needed prior to summing with the accumulated path metric. Nonetheless, in the conventional system of FIG. 3, the adder 305 would add the outputs of MUXs 301 and 303 eight times in generating the eight outputs x to be added to the different accumulated metrics.

An apparatus and method in accordance with the present invention takes advantage of the fact that the branch metrics are constant during the evaluation of all the possible state transition combinations (i.e., paths) associated with achieving the current state of the decoder and that not all of the possible outputs, i.e., those that have none or one non-zero addend, require an addition before summing with the accumulated path metric.

Figure 5:
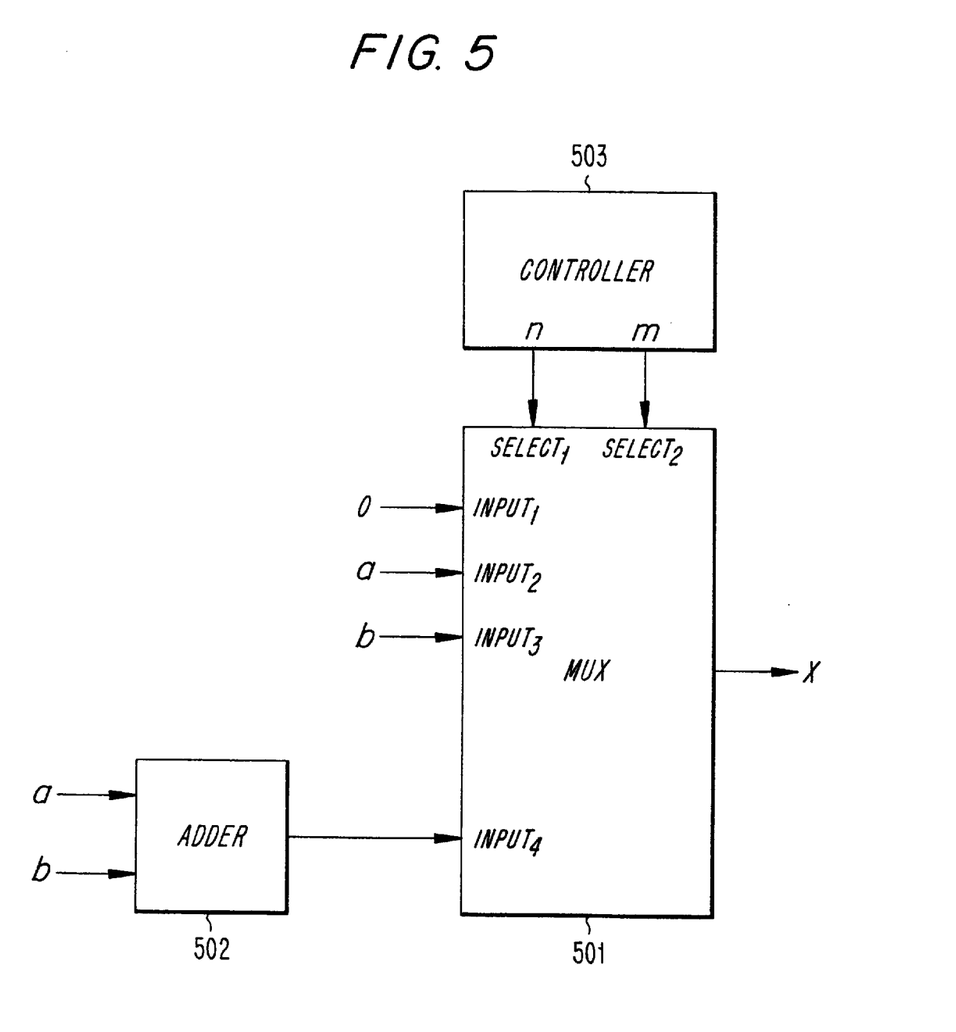
FIG. 5 depicts a circuit arrangement in accordance with a first exemplary embodiment of the present invention.

An exemplary apparatus in accordance with the present invention for evaluating the expression given by equation (1) is illustrated in FIG. 5. A MUX 501 is employed to select one of the four possible inputs (which are known to be the four possible outputs) 0, a, b, or a+b for output as x, wherein the path metric subcombination of a+b is performed by the adder 502. The selection is made based on the values of control variables n and m supplied by controller 503. The combinations output as x by the arrangement of FIG. 5 are then:

| n | m | x |
|---|---|---|
| 0 | 0 | 0 |
| 0 | 1 | b |
| 1 | 0 | a |
| 1 | 1 | a + b |

Consequently, for each evaluation of possible bit sequences based on a present bit, the values of a and b will remain constant. In view of this fact recognized by Applicant, the evaluations can be expedited significantly by utilization of circuit arrangements which are based on the concepts depicted in FIG. 5. This is due to, for example, the addition operation (a+b) only being performed once for the evaluation of all possible bit sequence combinations. By adding the values of metrics a and b together, in advance, appreciating that this sum is constant for a plurality of path evaluations, performance of the expression given by Equation (1) then becomes a matter of making an output selection. Cumulatively, the arrangement depicted in FIG. 5 provides a significant increase in throughput over the prior art arrangement of FIG. 3 by avoiding performance of the addition operation for each path evaluation.

Those skilled in the art will recognize that methods and circuit arrangements in accordance with the present invention may be extended in several respects. For example, although only four states are shown in the example of FIG. 2, more states may be used depending upon the type of convolutional code employed. More states will increase the number of path evaluations per received bit and, concomitantly, the benefits of the present invention. Moreover, the present invention can be extended to more than two received bit streams. For z bit streams, the number of possible outputs will be $2^z$. For example, an expression having three input terms (a1, a2, a3) can be given by:

$$x(n1,n2,n3)=a1*n1+a2*n2+a3*n3 \qquad (2)$$

Figure 6:
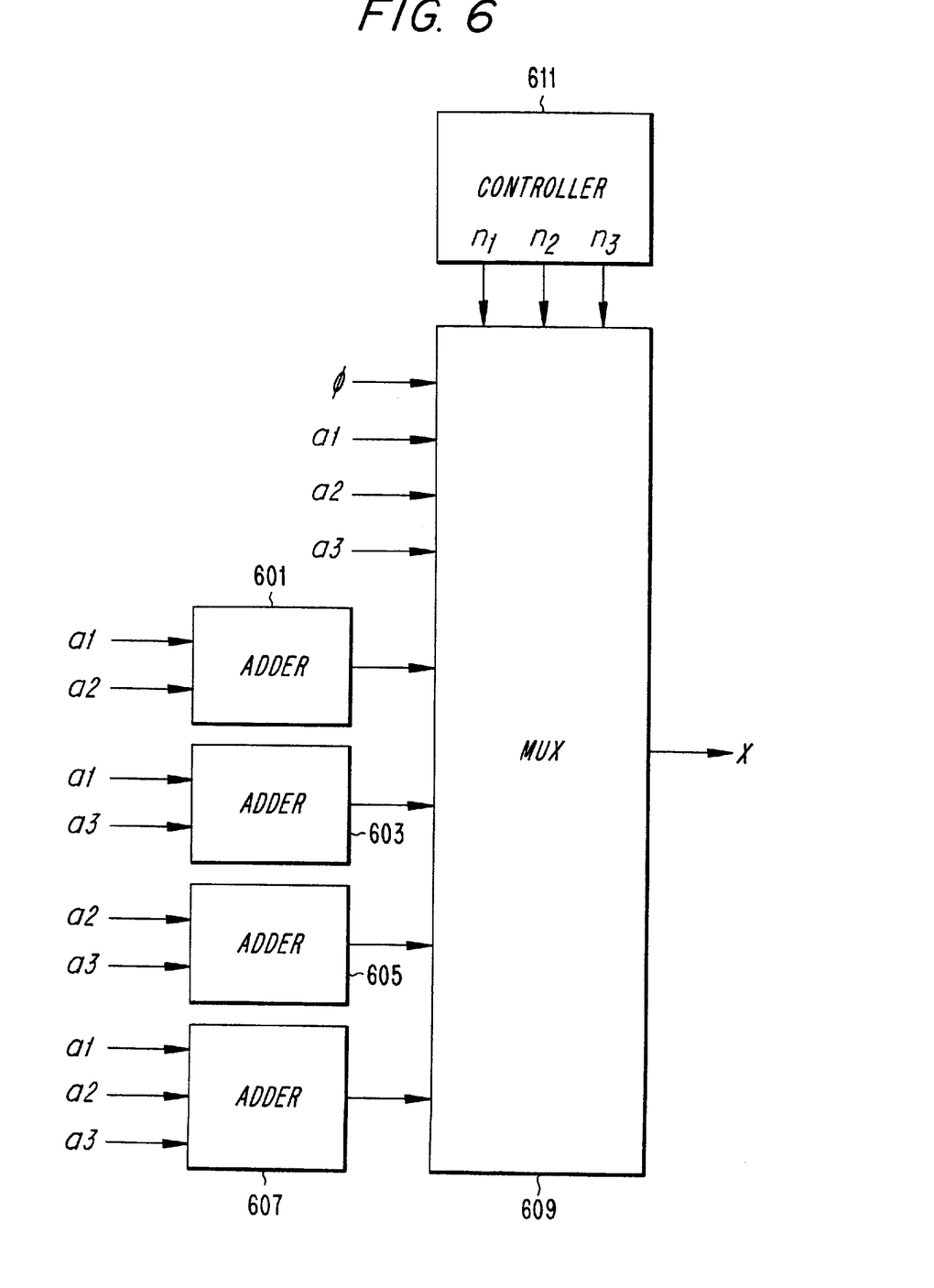
FIG. 6 depicts a circuit arrangement in accordance with another exemplary embodiment of the present invention.

An exemplary apparatus in accordance with the present invention for evaluating the expression given by Equation (2) is illustrated in FIG. 6. Therein, four adders 601, 603, 605 and 607 supply combinational inputs of metrics a1, a2 and a3 to MUX 609. Additionally, each of the non-additive outputs 0, a1, a2 and a3 are input to MUX 609. Then, depending upon the corresponding result of each of three trellises, one of the eight possible outputs will be selected by the appropriate binary value represented by state variables n1, n2 and n3 whose values are controlled by controller 611. The combinations output by the arrangement of FIG. 6 are:

| n1 | n2 | n3 | x |
|---|---|---|---|
| 0 | 0 | 0 | 0 |
| 0 | 0 | 1 | a3 |
| 0 | 1 | 0 | a2 |
| 0 | 1 | 1 | a2 + a3 |
| 1 | 0 | 0 | a1 |
| 1 | 0 | 1 | a1 + a3 |
| 1 | 1 | 0 | a1 + a2 |
| 1 | 1 | 1 | a1 + a2 + a3 |

One skilled in the art will appreciate that incorporation of the present invention into any decoding system requiring path metric evaluation significantly expedites operation. It is readily apparent that systems incorporating the present invention reduce the otherwise geometric increase in the number of additions which would be performed as the number of bit streams evaluated increases. Extension of the solution as depicted in FIG. 6 provides a gain in speed at an apparent cost of increased hardware. However, it will be appreciated that a number of advantages inherent with enhancements in speed can offset, or even reduce, the hardware requirements involved with the systems operating in accordance with the present invention.

An arrangement in accordance with the present invention provides an increase in speed of the evaluation of expressions like those given by equation (2) with little or no increase in components or silicon area. Power consumption is reduced because the amount of component switching is reduced. Cost may be reduced by replacing a large number of slow conventional circuit arrangements with a smaller number of faster circuit arrangements which incorporate the present invention (e.g., one component operating twice as fast can replace two components operating at half the speed). The cost, weight, silicon area and component count are correspondingly reduced. Application of the present invention may eliminate the need for other speed enhancement components or measures. Furthermore, a faster component will spend less time to perform an operation, thus allowing it to have more idle time during which an idle, or reduced power state may be invoked. The latter enables battery powered devices to operate for longer periods; reduces heat emissions and cooling requirements (e.g., fans, fins, and insulation).

The above-described exemplary embodiments are intended to be illustrative in all respects, rather than restrictive, of the present invention. In the instant application, various embodiments of the invention have been described in the context of a radiocommunications systems where an air interface renders transmitted bits susceptible to errors. However, one skilled in the art will readily appreciate that arrangements and methods incorporating the invention can be applied in any pertinent communications environment. These include, but are not limited to, wire-based systems (e.g., telephone communications, computer modems, facsimile machines, and cable TV), and fiber optic systems.

One skilled in the art will further appreciate that systems in accordance with the invention are especially suitable for cellular communications. In a typical cellular radio system, a geographical area, e.g., a metropolitan area, is divided into several smaller, contiguous radio coverage areas called "cells." The cells are served by a series of fixed radio stations called "base stations." The base stations are connected to and controlled by a mobile services switching center (MSC). The MSC, in turn, connected to the landline (wireline) public switched telephone network (PSTN). The telephone users (mobile subscribers) in the cellular radio system are provided with portable (hand-held), transportable (hand-carried) or mobile (car-mounted) telephone units (mobile stations) which communicate voice and/or data with the MSC through a nearby base station. The MSC switches calls between and among wireline and mobile subscribers, controls signalling to the mobile stations, compiles billing statistics, and provides for the operation, maintenance and testing of the system.

Figure 7:
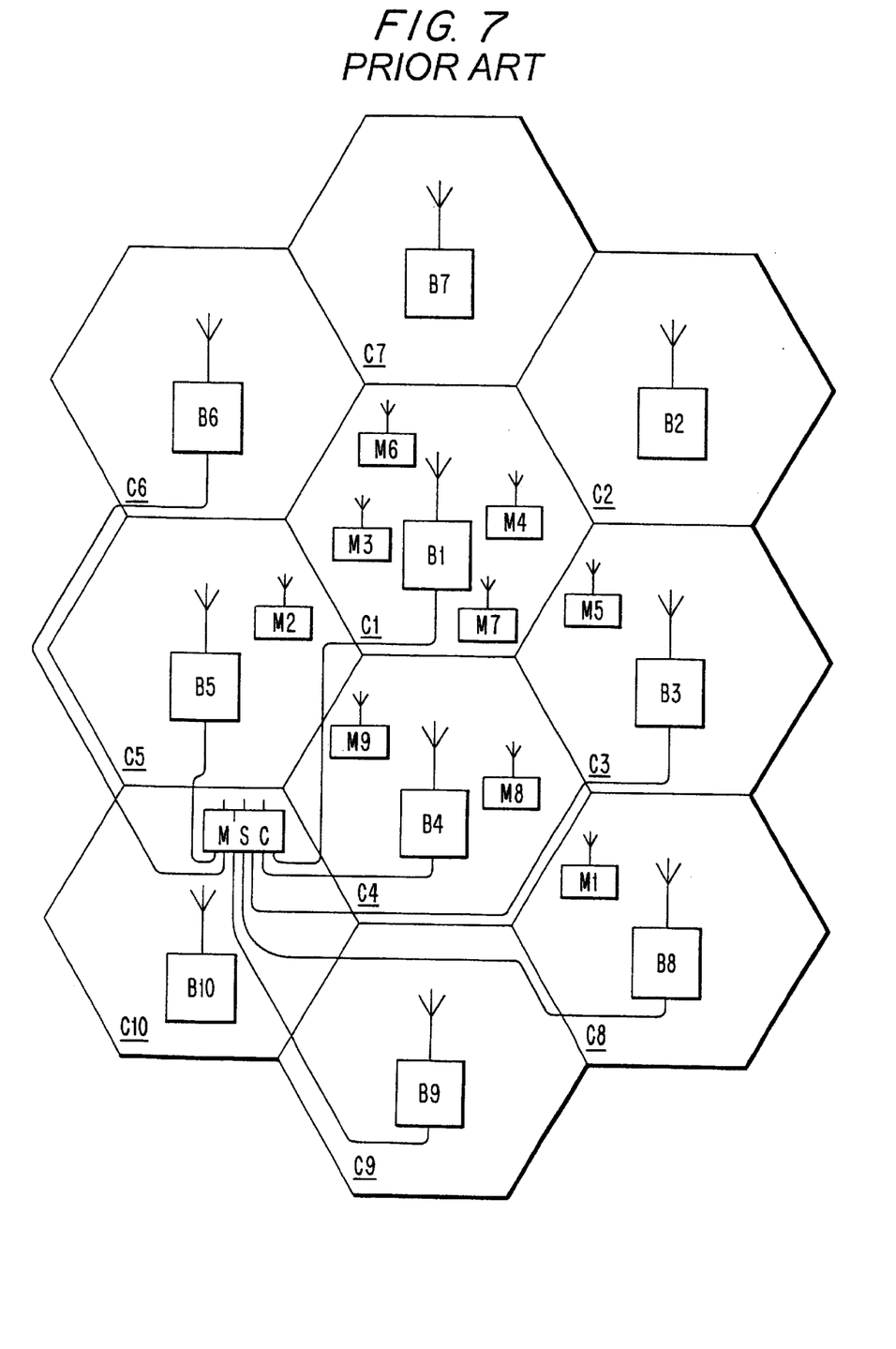
FIG. 7 depicts an architecture of a conventional cellular communications system.

FIG. 7 illustrates the architecture of a conventional cellular radio system built according to the Advanced Mobile Phone Service (AMPS) standard. In FIG. 7, an arbitrary geographic area may be seen divided into a plurality of contiguous radio coverage areas, or cells, C1–C10. While the system of FIG. 7 is, for illustration purposes, shown to include only ten cells, the number of cells may be much larger in practice. Associated with and located in each of the cells C1–C10 is a base station designated as a corresponding one of a plurality of base stations B1–B10. Each of the base stations B1–B10 includes a plurality of channel units, each comprising a transmitter, a receiver and a controller, as is well known in the art. A plurality of mobile stations M1–M9 are found in various ones of cells C1–C10. These mobile stations also include circuitry for transmitting and receiving signals over the air interface.

Methods and arrangements incorporating the present invention can be readily applied in both base and mobile stations within a cellular system such as the one depicted in FIG. 7. For instance, in the arrangement depicted in FIG. 4, encoders 404 and 406, interleaver 412, and transmitter 416 can be, for example, signal generating components in a base station. While mobile stations, in communication with the base station, contain the receiver 418, detector 420, deinterleaver 424 and the Viterbi decoder 426. It is readily apparent that a base station can also include receiving components such as the receiver 418, detector 420, deinterleaver 424 and the Viterbi decoder 426 to receive signals generated by a mobile station containing the encoders 404 and 406, interleaver 412, and transmitter 416.

In accordance with the foregoing disclosure, it is readily apparent that the present invention is capable of many variations. Detailed implementation can be derived from the description contained herein by a person skilled in the art. All such variations and modifications are considered to be within the scope and spirit of the present invention as defined by the following claims.

What is claimed is:

1. A circuit used to conditionally combine a plurality of bit metrics used in decoding a received information signal, said circuit comprising:

at least one adder having a plurality of input nodes each of which receives one of said plurality of bit metrics, said at least one adder providing as an output a sum of said plurality of bit metrics;

a multiplexor having a plurality of inputs, at least one each for: zero, each of said plurality of bit metrics individually, and said output sum of said at least one adder, said multiplexor also having a selection input which is operable to select one of said plurality of inputs; and a controller for providing said selection input to said multiplexor, wherein for each plurality of bit metrics supplied to said adder said controller provides a sequence of selection inputs to said multiplexor, such that said plurality of bit metrics are relatively constant as compared with said selection inputs.

2. The circuit claimed in claim 1, wherein said circuit is utilized in a Viterbi decoder.

3. The circuit claimed in claim 1, wherein said circuit evaluates the function $x(n,m)=n*a+m*b$, wherein $x(n,m)$ is a signal selected for output from said multiplexor, a and b are bit metric signals in the form of numerical constants which are provided to said multiplexor inputs and to said adder, and n and m are binary state signals generated by said controller.

4. An apparatus for performing an arithmetic function associated with a Viterbi decoder, the apparatus comprising:

a multiplexor having a plurality of input ports for receiving input signals, a selection port for selecting an input signal for output, and an output port, wherein one of said input signals has a value of zero;

a plurality of adders wherein each one of the plurality of adders is dedicated to providing a sum of a different combination of input signals, said multiplexor dedicating one of each of said plurality of input ports to receiving each input signal and receiving each sum of possible combinations of input signals provided by said plurality of adders; and a controller for providing selection inputs to said multiplexor, wherein for each plurality of input signals supplied to one of said adders, said controller provides a sequence of selection inputs to said multiplexor such that said plurality of said input signals are relatively constant as compared with said selection inputs.

5. An apparatus for adding signals corresponding to path metrics in a Viterbi decoder according to the expression $x(n,m)=n*a+m*b$, wherein $x(n,m)$ is an output signal value, a and b are path metric signals in the form of numerical constants, and n and m are binary state signals, the apparatus comprising:

a multiplexor having a plurality of inputs ports at least one of which is dedicated to receiving a discrete signal for each of zero, a, b, and (a+b); and a selection port for receiving inputs of n and m and outputting one of said discrete signals;

an adder for preparing the sum (a+b) for input to one of said plurality of multiplexor input ports; and a controller for providing said inputs, n and m, to said multiplexor, wherein for each plurality of said discrete signals supplied to said adder, said controller provides a sequence of said inputs to said multiplexor such that said plurality of discrete signals are relatively constant as compared with said inputs.

6. A decoder for decoding encoded signals, said decoder comprising:

receiver means for receiving an encoded signal;

detector means for detecting symbols contained in said encoded signal, said symbols comprising at least two interleaved bit streams each of which includes bit data and corresponding metric data;

deinterleaver means for separating said at least two interleaved bit streams into separate bit sequences; and Viterbi decoder means for decoding said separate bit sequences, in combination, to generate a reproduced bit stream;

wherein said Viterbi decoder means comprises:

at least one adder having a plurality of input nodes each of which receives one of said metric data from said at least two interleaved bit streams, said at least one adder providing as an output a sum of said metric data from said at least two interleaved streams;

a multiplexor having a plurality of inputs, at least one each for: zero, each of said metric data from said at least two interleaved bit streams individually, and said output sum of said at least one adder, said multiplexor also having a selection input which is operable to select one of said plurality of inputs; and a controller for providing said selection input to said multiplexor, wherein for each one of said metric data from said at least two interleaved bit streams supplied to said adder said controller provides a sequence of selection inputs to said multiplexor, such that said metric data from said at least two interleaved bit streams are relatively constant as compared with said selection inputs.

7. The decoder as claimed in claim 6, wherein said decoder is included in a cellular base station.

8. The decoder as claimed in claim 6, wherein said decoder is included in a cellular mobile station.

* * * * *